United States Patent
Lee et al.

(10) Patent No.: US 6,194,256 B1
(45) Date of Patent: Feb. 27, 2001

(54) METHOD FOR FABRICATING CMOS DEVICE

(75) Inventors: Jong Wook Lee; Gyu Seog Cho, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/340,427

(22) Filed: Jun. 28, 1999

(30) Foreign Application Priority Data

Jun. 29, 1998 (KR) .................................................. 98-24735

(51) Int. Cl.⁷ ................................................. H01L 21/336
(52) U.S. Cl. ............................................................ 438/197
(58) Field of Search ................................... 438/154, 199, 438/201, 202, 207, 221, 225, 231, 232, 234, 244, 296, 297, 222, 224, 226, 227, 228, 243, 262, 197

(56) References Cited

U.S. PATENT DOCUMENTS

| | | | |
|---|---|---|---|
| 4,922,317 | * 5/1990 | Mihara | 357/42 |
| 5,496,764 | 3/1996 | Sun . | |
| 5,670,387 | 9/1997 | Sun . | |
| 5,679,599 | 10/1997 | Mehta . | |
| 5,691,226 | * 11/1997 | Foerstner et al. | 437/59 |
| 5,789,286 | * 8/1998 | Subbanna | 438/221 |
| 5,923,977 | * 7/1999 | Ahmad et al. | 438/262 |

FOREIGN PATENT DOCUMENTS

| | | |
|---|---|---|
| 5-21589 | 1/1993 | (JP) . |
| 5-55358 | 3/1993 | (JP) . |
| 8-181296 | 7/1996 | (JP) . |
| 9-74133 | 3/1997 | (JP) . |
| 9-172061 | 6/1997 | (JP) . |

* cited by examiner

Primary Examiner—David Nelms
Assistant Examiner—David Nhu
(74) Attorney, Agent, or Firm—Ladas & Parry

(57) ABSTRACT

Disclosed is a method for fabricating CMOS device using a SOI substrate, and more particularly the method for fabricating CMOS device capable of improving mobility of electron and hole. The present invention provides a method for fabricating CMOS device comprising the steps of: providing an SOI substrate having a stacking structure of a base layer, a buried oxide layer and a semiconductor layer, wherein the SOI substrate is divided into a first region where a PMOS is formed later and a second region where an NMOS is formed later; forming first field oxide films to be contacted with the buried oxide layer by applying a thermal oxidation to a selected portion of the semiconductor layer being disposed in the first region of the SOI substrate; forming trenches with a depth to be contacted with the buried oxide layer in a selected portion of the semiconductor layer being disposed in the second region of the SOI substrate and then forming second field oxide films by filling the trenches with an insulating layer; and forming the PMOS in the portion of the semiconductor layer being defined by those first field oxide films, and the NMOS in the portion of the semiconductor layer being defined by those second field oxide films.

6 Claims, 4 Drawing Sheets

METHOD FOR FABRICATING CMOS DEVICE

BACKGROUND OF THE INVENTION

1. Field of the Invention

The present invention relates to a method for fabricating a CMOS device using an silicon-on-insulator(SOI) substrate, and more particularly to a method for fabricating CMOS device capable of improving mobility of electron and hole.

2. Description of the Related Art

Due to the fast development in semiconductor device industry, a semiconductor device using the SOI substrate instead of a silicon substrate made of bulk silicon, has been proposed. According to this SOI device, adjoining devices are completely isolated from each other and a reduction of the junction capacitance can be obtained, therefore a low power and high speed device can be manufactured.

FIG. 1 is a cross-sectional view showing a conventional SOI substrate provided with a field oxide film. As shown in the drawing, the SOI substrate 10 has a stacking structure comprising a base layer 1 as a supporting means and a semiconductor layer 3 in which a device is to be formed later, and a buried oxide layer 2 being sandwiched between the base layer 1 and the semiconductor layer 3. This SOI substrate 10 is generally manufactured by the SIMOX (separation by implanted oxygen) method implanting oxygen ions and the bonding method that two silicon substrates are bonded each other.

The characteristic of the device formed on the SOI substrate depends on the thickness of semiconductor layer. For instance, the characteristic of the device is improved when the thickness of semiconductor layer 3 is uniform. The thickness of semiconductor layer 3 is preferable to be set below 100 nm.

On the other hand, as shown in the drawing, in the SOI substrate 10 provided with an isolation layer, i.e. the field oxide film 4 formed by the LOCOS process, the field oxide film 4 is formed to be contacted with the buried oxide layer 2, therefore an external stress is applied to the semiconductor layer 3 during the formation of field oxide film 4. However, when a CMOS device comprising NMOS and PMOS is formed on the semiconductor layer 3, it is difficult to expect an enhanced CMOS device.

In detail, it is well known that when a CMOS comprising NMOS and PMOS is formed in the semiconductor layer being affected by the external stress, the electron mobility in the NMOS is decreased while the hole mobility in the PMOS is increased. For example, the more the stress within the semiconductor layer, the smaller the electron mobility, and the more the compressive stress within the semiconductor layer, the more the hole mobility.

Further, it is disclosed in the "Silicon-On-Insulator technology and devices VIII" edited by S. Cristoloveanu, pp. 335 that the hole mobility in the semiconductor layer of the SOI substrate, is larger than the hole mobility in the bulk silicon when the compressive stress is applied to the semiconductor layer.

Accordingly, the CMOS device with high speed and low power consumption should have a desired degree of hole mobility in the PMOS and electron mobility in the NMOS device. However, when the CMOS device is formed on the SOI substrate by the conventional method, both mobilities are not improve at the same time, therefore it is difficult to obtain those properties applicable to the manufacturing process of the device with high speed and low power consumption.

SUMMARY OF THE INVENTION

Therefore, it is the object of the present invention to provide a method for fabricating CMOS device capable of improving the electron mobility in the NMOS and the hole mobility in the PMOS.

To accomplish the foregoing object, the present invention provides a method for fabricating CMOS device comprising the steps of: providing an SOI substrate having a stacking structure of a base layer, a buried oxide layer and a semiconductor layer, wherein the SOI substrate is divided into a first region where a PMOS is formed later and a second region where an NMOS is formed later; forming first field oxide films to be contacted with the buried oxide layer by applying a thermal oxidation to a selected portion of the semiconductor layer being disposed in the first region of the SOI substrate; forming trenches with a depth to be contacted with the buried oxide layer in a selected portion of the semiconductor layer being disposed in the second region of the SOI substrate and then forming second field oxide films by filling the trenches with an insulating layer; and forming the PMOS in the portion of the semiconductor layer being defined by those first field oxide films, and the NMOS in the portion of the semiconductor layer being defined by those second field oxide films.

The present invention further provides a method for fabricating a CMOS device comprising: providing an SOI substrate having a stacking structure of a base layer, a buried oxide layer and a semiconductor layer, wherein the SOI substrate is divided into a first region where a PMOS is formed later and a second region where an NMOS is formed later; forming a pad oxide layer and a nitride layer on the semiconductor layer of the SOI substrate successively; patterning the pad oxide layer and the nitride layer to expose selected portions of the semiconductor layer being disposed in the first region of the SOI substrate; forming first field oxide films by applying the thermal oxidation to the exposed portions of the semiconductor layer; forming a mask pattern to expose selected portions of the nitride layer being disposed in the second region of the SOI substrate over a resultant; forming trenches to expose the buried oxide layer by etching the exposed portions of the nitride layer, the pad oxide layer portion beneath the exposed nitride layer and the semiconductor layer; removing the mask pattern; forming an insulating layer over the entire resultant with a thickness enough to fill the trenches; polishing the insulating layer by using the nitride layer as a polishing stopper; forming second field oxide films of trench type by etching the nitride layer, The pad oxide layer, the insulating layer remained on those first field oxide films and a selected thickness of the insulating layer filled in the trench; and forming the PMOS in the portion of the semiconductor layer being defined by those first field oxide films, and forming the NMOS in the portion of the semiconductor layer being defined by those second field oxide films.

BRIEF DESCRIPTION OF THE DRAWINGS

These and other features of the present invention can be readily understood with reference to the accompanying drawings.

DETAILED DESCRIPTION OF THE INVENTION

A detailed description of the preferred embodiment is made with reference to the attached drawings.

Figure 1:
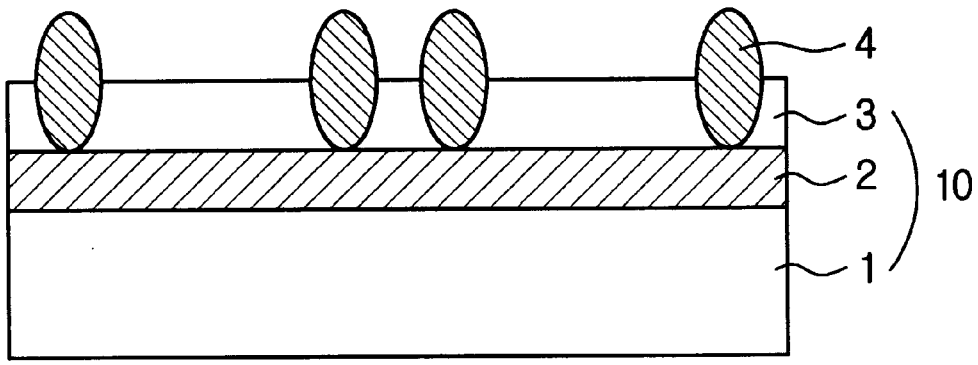
FIG. 1 is cross-sectional view showing a conventional SOI substrate provided with a field oxide film.
Figure 2A:
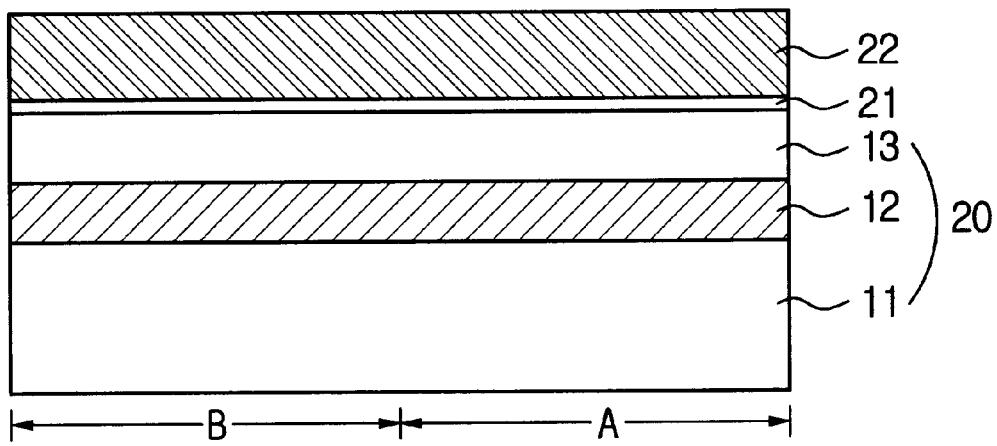
FIGS. 2A to 2G illustrate a method for fabricating a CMOS device according to an embodiment of the present invention.

Referring to FIG. 2A, an SOI substrate 20 is provided. The SOI substrate 20 has a stacking structure comprising a base layer 11 as a means for supporting, and a semiconductor layer 13 in which a device is to be formed later, and a buried oxide layer 12 being sandwiched between the base layer 11 and the semiconductor layer 13. Furthermore, the SOI substrate 20 is divided into a first region A where a PMOS is formed later and a second region B where an NMOS is formed later, and a pad oxide layer 21 and a nitride layer 22 are formed on the semiconductor layer 13 successively.

Figure 2B:
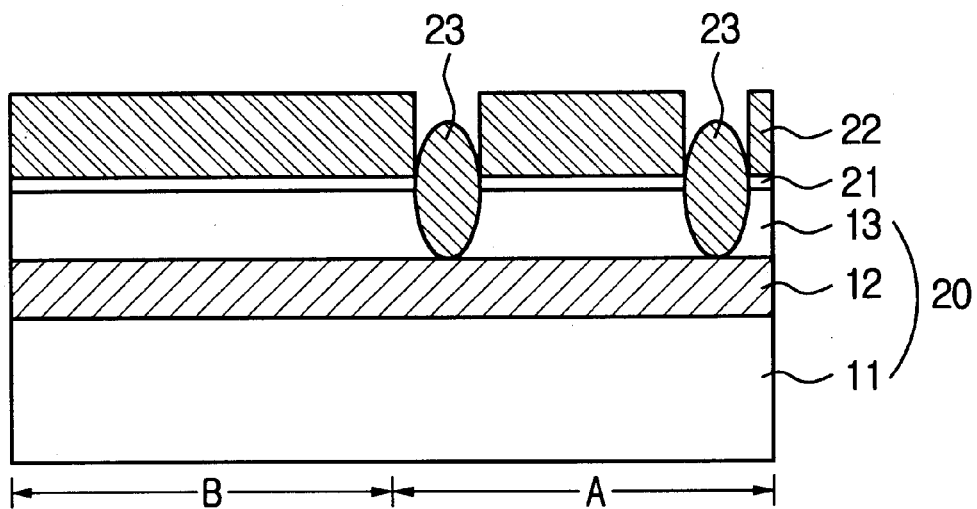

Referring to FIG. 2B, the nitride layer 22 and the pad oxide layer 21 are patterned to expose selected portions of the semiconductor layer 13 disposed in the first region A of the SOI substrate 20, and first field oxide films 23 are formed by applying thermal oxidation to the exposed portions of the semiconductor layer 13. Herein, the first field oxide films 23 are in contact with the buried oxide layer 12 by controlling temperature of the thermal oxidation process and its process time.

Figure 2C:
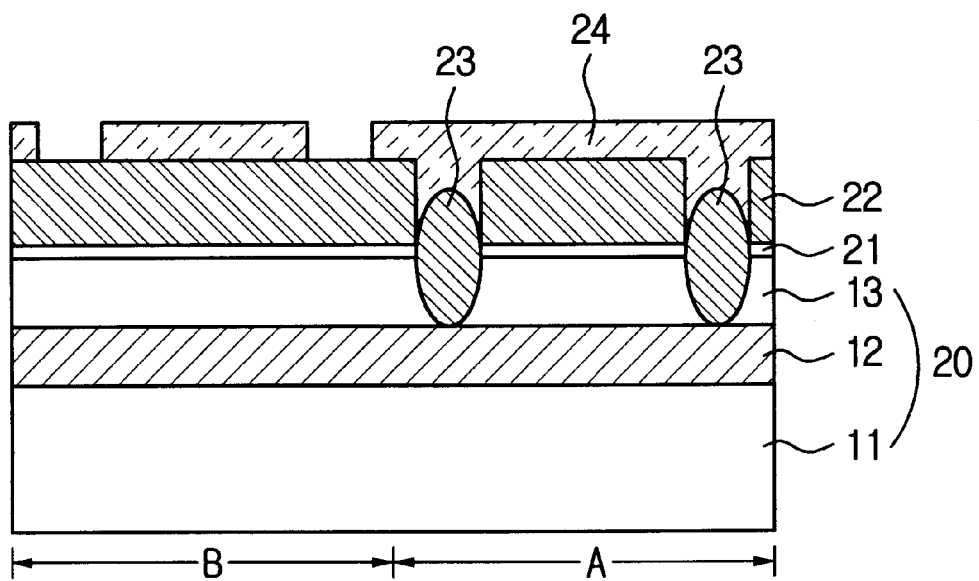

Referring to FIG. 2C, a photosensitive film 24 is formed on the resultant, and then, the photosensitive film 24 is exposed and developed to expose selected portions of the nitride layer 22 being disposed in the second region B of the SOI substrate 20.

Figure 2D:
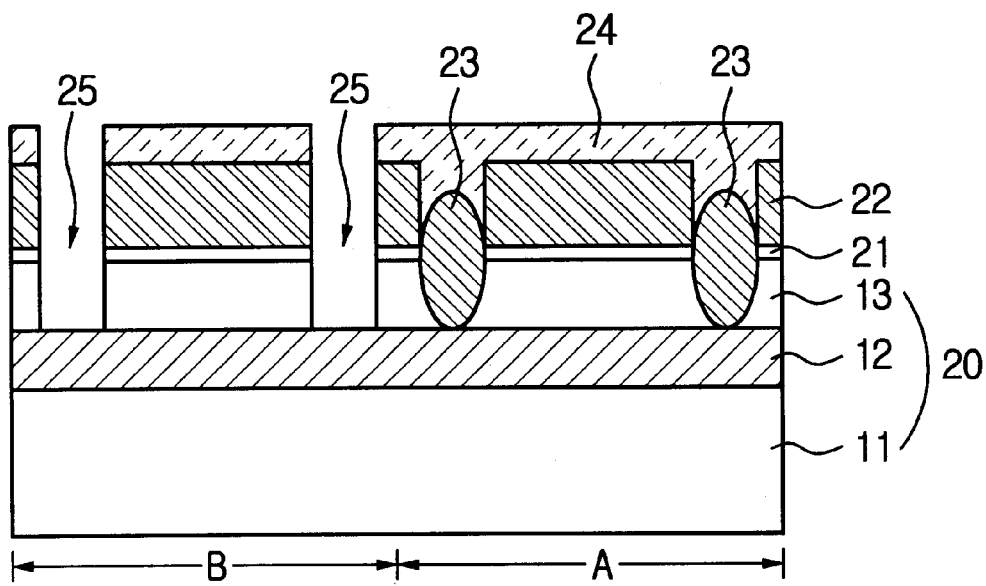

Referring to FIG. 2D, trenches 25 are formed to expose the buried oxide layer 12 by successively dry-etching the exposed portions of the nitride layer 22, the pad oxide layer portion beneath the exposed nitride layer 22 and the semiconductor layer 13.

Figure 2E:
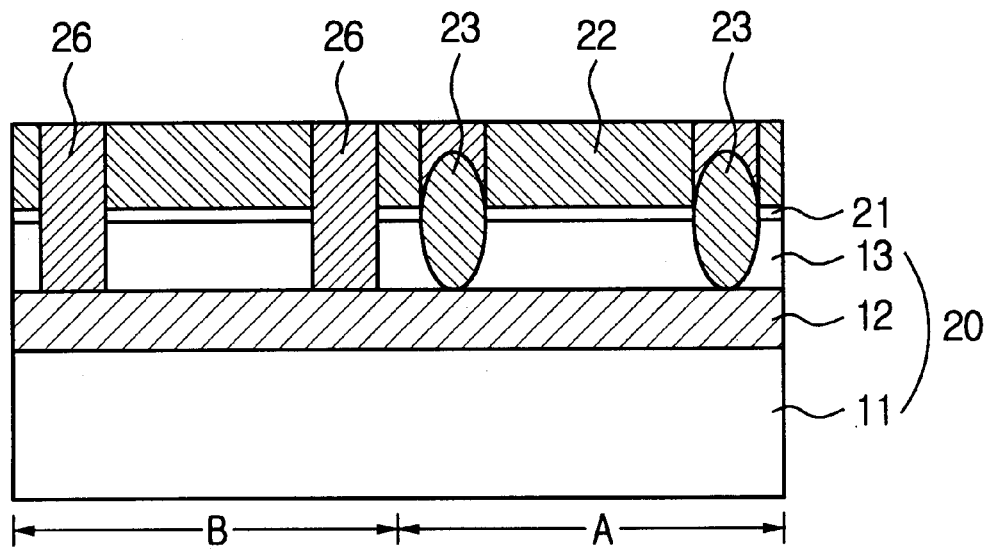

Referring to FIG. 2E, the photosensitive film 24 being used as an etching mask is removed. An insulating layer 26 is formed over the resultant with a sufficient thickness to fill the trenches 25 entirely. Next, the insulating layer 26 is polished by the Chemical Mechanical Polishing process that employs the nitride layer 22 as a polishing stopper.

Figure 2F:
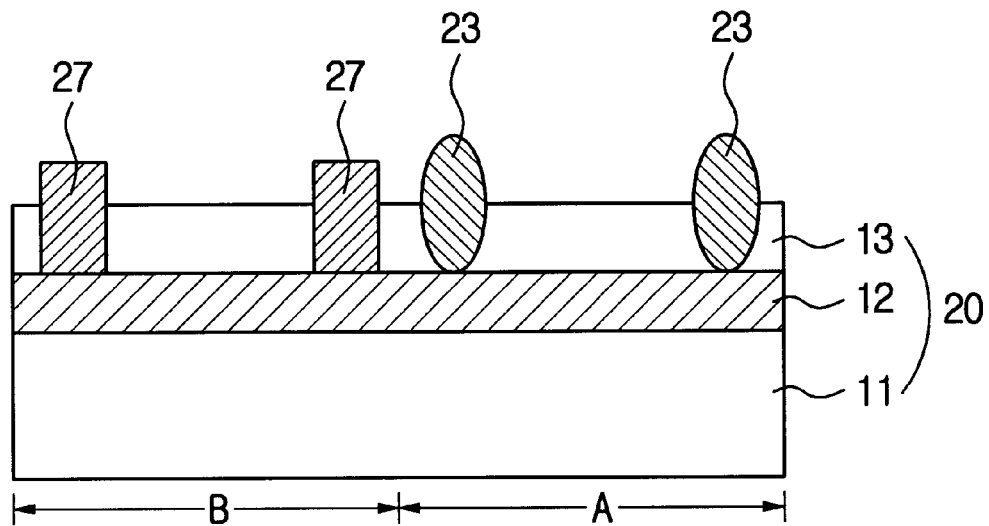

Referring to FIG. 2F, the nitride layer, the pad oxide layer, the insulating layer remained on the first field oxide films 23 and a selected thickness of the insulating layer 26 filled in the trench 25 are removed by an etching process thereby forming second field oxide films 27 of trench type.

Figure 2G:
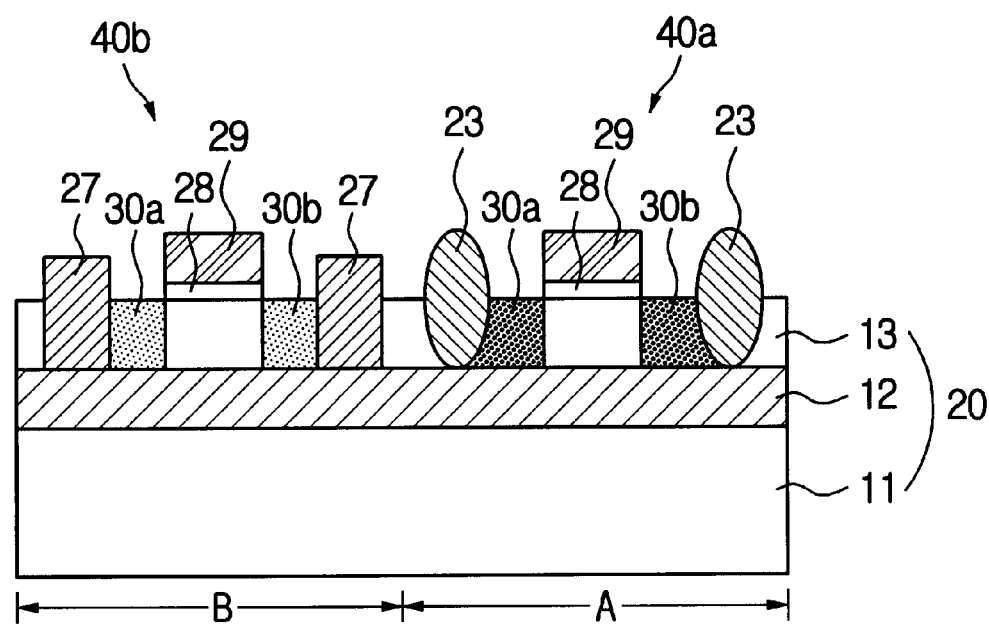

Referring to FIG. 2G, according to a known semiconductor process, a PMOS device 40a is formed on the semiconductor layer 13 of the first region A being defined by those first field oxide films 23 and an NMOS device 40b is formed on the semiconductor layer 13 of the second region B being defined by those second field oxide films 27. Herein, the PMOS device 40a and the NMOS device 40b, as shown in the drawing, include a gate oxide layer 28, a gate electrode 29 and source and drain regions 30a, 30b.

In the CMOS device according to the present invention, the hole mobility in the PMOS and the electron mobility in the NMOS are all improved.

That is to say in detail, a compressive stress is applied to the semiconductor layer 13 being defined by those first field oxide films 23 during a thermal oxidation process. Accordingly, the hole mobility in the PMOS is improved when the PMOS device is formed on the semiconductor layer that the compressive stress exists therein.

Further, when the field oxide films are formed by the thermal oxidation process, the compressive stress is applied to the semiconductor layer. On the other hand, when those field oxide films are formed by the trench process, the stress in the semiconductor layer may be reduced. Therefore, the electron mobility in the NMOS device formed in a semiconductor layer is improved since the semiconductor layer region being defined by those second field oxide films 27 of trench type has a reduced stress existing therein.

While performing the local oxidation process, the compressive stress applied to the semiconductor layer can be controlled by adjusting process conditions, such as process time and temperature, Additionally, the thickness of the buried oxide layer may affect the compressive stress. In other words, the thinner the buried oxide layer is, the more the compressive stress exists in the semiconductor layer. For example, the thickness of the buried oxide layer is preferably 100 nm, and to improve the characteristic of PMOS, amount of the stress existing in the buried oxide layer must be over $1-100^{10}$ dyne/cm$^2$.

As discussed above, according to the present invention, the hole mobility in the PMOS and the electron mobility in the NMOS are all improved by increasing the compressive stress in the semiconductor layer where the PMOS is to be formed later and by reducing the compressive stress in the semiconductor layer where the NMOS is to be formed later.

Therefore, it is expected to improve properties of the CMOS device and especially there are various advantages, such as high speed and low power properties applicable to the device fabrication.

Various other modifications will be apparent to and can be readily made by those skilled in the art without departing from the scope and spirit of the present invention.

What is claimed is:

1. A method for fabricating CMOS device comprising the steps of:

providing an SOI substrate having a stacking structure of a base layer, a buried oxide layer and a semiconductor layer, wherein the SOI substrate is divided into a first region where a PMOS is formed later and a second region where an NMOS is formed later;

forming first field oxide films to be contacted with the buried oxide layer by applying a thermal oxidation to a selected portion of the semiconductor layer being disposed in the first region of the SOI substrate;

forming trenches with a depth to be contacted with the buried oxide layer in a selected portion of the semiconductor layer being disposed in the second region of the SOI substrate and then forming second field oxide films by filling the trenches with an insulating layer; and forming the PMOS in the portion of the semiconductor layer being defined by those first field oxide films, and the NMOS in the portion of the semiconductor layer being defined by those second field oxide films.

2. The method as claimed in claim 1, wherein the step of forming the first field oxide films further comprises the steps of:

forming a pad oxide layer and a nitride layer on the semiconductor layer of the SOI substrate successively;

exposing selected portions of the semiconductor layer being disposed in the first region of the SOI substrate by patterning the pad oxide layer and the nitride layer; and applying thermal oxidization process to the exposed portions of the semiconductor layer.

3. The method as claimed in claim 2, wherein in the step of forming those first field oxide films, those field oxide films are formed to be contacted with the buried oxide layer by controlling temperature and time conditions of the thermal oxidation process.

4. The method as claimed in claim 2, wherein the step of forming the second field oxide films further comprises the steps of:

forming a mask pattern to expose the nitride layer being disposed in the second region of the SOI substrate;

forming trenches to expose the buried oxide layer by etching the exposed portions of the nitride layer, the pad oxide layer portion beneath the exposed nitride layer and the semiconductor layer;

removing the mask pattern;

forming an insulating layer over the entire resultant enough to fill the trenches;

polishing the insulating layer by employing the nitride layer as a polishing stopper; and removing the nitride layer, the pad oxide layer, the insulating layer filled in the trenches by a selected thickness.

5. A method for fabricating CMOS device comprising the steps of:

providing an SOI substrate having a stacking structure of a base layer, a buried oxide layer and a semiconductor layer, wherein the SOI substrate is divided into a first region where a PMOS is formed later and a second region where an NMOS is formed later;

forming a pad oxide layer and a nitride layer on the semiconductor layer of the SOI substrate successively;

patterning the pad oxide layer and the nitride layer to expose selected portions of the semiconductor layer being disposed in the first region of the SOI substrate;

forming first field oxide films by applying the thermal oxidation to the exposed portions of the semiconductor layer;

forming a mask pattern to expose selected portions of the nitride layer being disposed in the second region of the SOI substrate over a resultant;

forming trenches to expose the buried oxide layer by etching the exposed portions of the nitride layer, the pad oxide layer portion beneath the exposed nitride layer and the semiconductor layer;

removing the mask pattern;

forming an insulating layer over the entire resultant with a thickness enough to fill the trenches;

polishing the insulating layer by using the nitride layer as a polishing stopper;

forming second field oxide films by etching the nitride layer, the pad oxide layer, the insulating layer remained on those first field oxide films and a selected thickness of the insulating layer filled in the trenches; and forming the PMOS in the portion of the semiconductor layer being defined by those first field oxide films, and forming the NMOS in the portion of the semiconductor layer being defined by those second field oxide films.

6. The method as claimed in claim 5, wherein in the step of forming those first field oxide films, the field oxide films are formed to be contacted with the buried oxide layer by controlling temperature and time conditions of the thermal oxidation process.

* * * * *